United States Patent [19]

Olyphant, Jr.

[11] 4,451,527

[45] May 29, 1984

[54] CONFORMABLE METAL-CLAD LAMINATE

[75] Inventor: Murray Olyphant, Jr., Lake Elmo, Minn.

[73] Assignee: Minnesota Mining and Manufacturing Company, St. Paul, Minn.

[21] Appl. No.: 287,773

[22] Filed: Jul. 28, 1981

[51] Int. Cl.³ ................................................ B32B 7/00
[52] U.S. Cl. .................................... 428/220; 428/332; 428/422; 428/457; 428/337; 428/253; 428/268
[58] Field of Search ............... 428/457, 121, 268, 253, 428/332, 337, 422, 220

[56] References Cited

U.S. PATENT DOCUMENTS

| | | | |
|---|---|---|---|
| 2,955,974 | 10/1960 | Allen et al. | 428/421 |
| 3,136,680 | 6/1964 | Hochberg | 428/422 |
| 4,230,758 | 10/1980 | Nagai et al. | 428/421 |
| 4,314,002 | 2/1982 | Olzumi et al. | 428/480 |

Primary Examiner—George F. Lesmes
Assistant Examiner—E. Rollins Buffalow
Attorney, Agent, or Firm—Donald M. Sell; James A. Smith; Gerald F. Chernivec

[57] ABSTRACT

A metal clad laminate of at least about 20 mils dielectric thickness containing a low-loss dielectric soft polymeric material and at least two layers of glass cloth reinforcement, wherein the separation between the metal cladding and the nearest layer of glass cloth is at least about 7 mils of the soft polymeric material.

7 Claims, No Drawings

CONFORMABLE METAL-CLAD LAMINATE

DESCRIPTION

1. Technical Field

The invention relates to a metal-clad laminate suitable for use in providing a substrate for printed circuitry.

2. Background Art

Printed circuit substrates for electronic devices and components which operate at ultrahigh and microwave frequencies generally must exhibit stable and reproducible dielectric constants and low dielectric losses. Such critical requirements limit the choice of base polymeric materials useful in such substrates to low dielectric loss materials such as polyethylene, polystyrene and fluorocarbon resins such as polytetrafluoroethylene. Because of their excellent electrical, thermal and chemical properties, the fluorocarbon family of resins has become the most widely used polymeric material for such circuit board applications.

In most instances, however, it is desirable or essential that the polymeric material be reinforced in order to provide proper dimensional stability during processing and upon exposure to environmental temperature changes, and in particular to those extreme temperature changes inherent in space applications, such as in satellite and missile radar. The most cost effective and widely employed reinforcing materials are glass fibers, which are incorporated into laminates to impart dimensional stability thereto. Glass fiber-reinforced fluorocarbon products are generally specified in the type designations of: "Military Specification: Plastic Sheet Laminated, Metal-Clad (For Printed Wiring) General Specification for MIL-P-13949F". The glass fibers may be in the form of woven glass cloth, as in Types GT, GX and GY. Alternatively, the fibers may be distributed throughout the polymeric material in the form of random non-woven microfibers, as in Types GP and GR of the foregoing Military Specification. The circuit substrates are then commonly supplied to the circuit fabricator with a metal foil, such as copper, laminated to both faces thereof.

For many ultrahigh frequency and microwave applications, either the woven glass or the random fiber reinforcement will provide the necessary dimensional stability to the resultant circuit substrate. Therefore, the products are in this case mostly interchangeable and competitive. However, where a high degree of dimensional stability is required, as, for example, to preserve the precise dimensions of multiple layers of a missile guidance system so that interlayer registration is accurately maintained, the fluorocarbon circuit substrate laminates incorporating parallel layers of glass cloth have well recognized superiority. The reason therefor is believed to be that the glass threads or yarns are continuous in the glass cloth reinforced products and thus act similar to structural reinforcing rods. Conversely, the random glass fiber product allows displacement between the fibers, thereby enabling dimensional changes to occur under mechanical stress.

Because the random fiber reinforced fluorocarbon products exhibit this dimensional change under stress, such products have historically been preferred for applications such as wrap around missile and satellite antennas where the product must be formed to conform to the outer surface of a cylinder or other surface of revolution. In fact, a random fiber laminate does allow a greater degree of flexing or bending before adverse effects occur than does the equivalent laminate using glass cloth reinforcement for those dielectric laminates which are at least about 20 mils thick and have at least 2 layers of glass cloth reinforcement. However, in order to have this bending or flexing capability, fabricators of such circuitry for missiles, etc., which typically utilize laminates of at least about 30 mils in thickness, have had to forego the advantageous stability of the glass cloth reinforced product.

Surprisingly, I have now found that the relatively poor conformability which was heretofore thought to be inherent in glass cloth reinforced fluorocarbon laminates can be overcome if the article is constructed in accordance with the method of my invention. The novel construction has unexpectedly been found capable of being bent to much smaller radii than heretofore possible before the onset of undesirable wrinkling of the foil cladding on the inside of the bend.

DISCLOSURE OF INVENTION

In accordance with the invention, there is provided a metal clad laminate of at least about 20 mils dielectric thickness, which has a metallic foil on at least one surface thereof and contains at least one low-loss dielectric soft polymeric material and at least two layers of glass cloth reinforcement, wherein the separation between the metallic foil and the nearest layer of glass cloth is at least about 7 mils of the soft polymeric material, preferably a fluorocarbon. By containing at least about 7 mils of polymeric material between the metallic foil and the closest glass cloth layer, the laminate can be bent without undesirable wrinkling to a much smaller radius than is possible with conventional constructions.

DETAILED DESCRIPTION

Fluorocarbon resins are soft polymers which are ductile and exhibit dimensional change under mechanical stress. By "soft" is meant that the polymer exhibits a room temperature elongation of at least about 75 percent and a tensile modulus of less than about 120,000 psi. These polymer base characteristics are necessary to provide a conformable laminate.

In addition to being soft, polymers useful herein must have a dielectric loss tangent of less than about 0.001 in the frequency range from about 1 to about 10 GHz (hereinafter termed low loss dielectric polymers). Examples of such materials include polyethylene, polypropylene and fluorocarbon resins, a preferred example thereof being polytetrafluoroethylene (PTFE).

Initially, I thought that an effective way to prevent the onset of wrinkling of the metallic foil on the inside of the bend would be to further reinforce the soft polymeric material at the surface proximate the inside foil. This is because I felt that the foil wrinkled because it was in compression, and by reinforcing further the area proximate the inside surface, the glass cloth would prevent the assumed compression and consequent wrinkling of the foil. Now, however, I have unexpectedly found that in standard constructions, the onset of wrinkling of the foil is associated with and seems to be caused by the wrinkling or buckling of the closest glass cloth layer. Apparently, the local distortion of the laminate by the buckling of the glass cloth layer on the inside of the bend transfers through the conventionally thin polymeric section to the metallic foil and thereby causes the foil also to start buckling or wrinkling. Further bending then imposes still further wrinkling at the weakened and deformed foil location. Surprisingly, I found that when a substantial layer of unreinforced soft polymeric material laminated between the foil and the nearest layer of glass cloth, no wrinkling of the metallic foil was observed at radii which were substantially less then the radius at which wrinkles would form in a standard construction.

Glass cloth-reinforced laminates for electronic and microwave applications are typically manufactured by bonding together, under pressures of from about 200 to about 500 pounds per square inch and temperatures of from about 700° to 750° F., sufficient layers of resin-coated glass cloth to produce the desired finished laminate thickness.

Commonly used types of glass cloth are those woven from yarns of E-glass in such well known constructions as Styles 108 or 1080, commercially available from the Burlington Mills. Style 108 glass, as an example, has a weave of 60 by 47 2-ply yarn ends per inch. The yarns are comprised of sufficient glass fibers of a size of 900 yards per pound, to produce a nominal fabric weight of 1.45 ounces per yard. In style 1080, single ply yarns of fibers of a size of 450 yards per pound are used to produce the cloth which is otherwise the same as Style 108. E-glass is a standard glass composition which possesses good electrical, mechanical and weaving characteristics and is almost universally employed for glass cloth reinforced electrical laminates of all sorts.

The glass cloth is impregnated and coated, usually in at least two passes, separated by drying or sintering steps, which a polymeric resin to suitable coating form. One commonly used coating resin is Teflon 30B, commercially available from the DuPont Company, which is a sixty percent solids suspension of PTFE in water, with an added wetting agent. The coated cloth is dried by passing through an oven for sufficient time and at sufficient temperature to remove the water. If desired, sintering of the coating can be undertaken by raising the temperatures of the coating to above about 700° F.

The coating process is adjusted to produce the desired percent weight of resin in and on the coated glass cloth. The range of most commonly used coating weights, based on the weight percent of PTFE resin, is from 65 to 82 percent, although coating weights outside this range can be useful for special purposes.

A critical design property which is controlled by the percent resin in the finished laminate is the dielectric constant. For example, in order to produce the nominal 2.55 and 2.45 dielectric constants of the above-referenced Military Specification, from about 72 to about 78 percent by weight should be resin. Alternatively, a construction can be based on a desired average increment of laminate thickness per glass cloth layer contained therein. For example, in CuClad 233, a commercially available glass cloth reinforced laminate available from the Minnesota Mining and Manufacturing Company, the increment of laminate thickness is 5 mils per layer of glass cloth. This construction provides a dielectric constant of 2.33 in the microwave test specified in MIL-P-13949F, and beneficially provides this same dielectric constant for all laminate thicknesses which are integral multiples of five mils, such as commonly used thicknesses of 5, 10, 30 and 60 mils, which will obviously contain, respectively, 1, 2, 6 and 12 layers of glass cloth.

A layer of thermoplastic fluorocarbon resin, such as Teflon FEP (a fluorinated ethylene propylene resin) of Teflon PFA (a perfluoro alkoxy resin), both commercially available from the DuPont Company, may be inserted between the metallic foil and the polymeric resin coated glass cloth to improve the bond of the metallic foil to the laminate. Typically, such a layer is provided by a film of a thickness from about 0.5 to about 2 mils. In addition, such a layer of thermoplastic fluorocarbon resin can be inserted beneath the first or second layer of coated glass cloth, counting inwardly from the metallic foil on both sides. In this location, the thermoplastic layer serves to even out the pressure variations through the laminate which might otherwise occur because of uneven coating thicknesses on the coated glass cloth.

Such layers of thermoplastic fluorocarbon resins behave electrically in the laminate structure as an equivalent thickness of PTFE resin. Therefore, statements herein about PTFE resin weights, percentages, or thickness shall be taken to include the contribution of any thermoplastic fluorocarbon resins which such are used.

It is not essential that the glass cloth layers be equally spaced throughout the laminate in order to provide the desired dielectric properties. Therefore, it is common to mix layers of coated glass cloth in the laminate which have different coating weights. In order to remain flat after pressing the laminates, it is usually required that the construction be symmetrical about its central plane.

After forming the laminate in the manner described above, a layer of copper or other metallic foil is commonly bonded to both outer faces thereof. Copper is a typical and preferred metallic foil and examples of copper foils utilized with such constructions include one ounce electrodeposited copper foil, which is commonly known in the trade as ED copper. Such a foil has a micro roughened surface to improve the bonding thereof to PTFE resins. In addition, rolled copper foil can also be utilized.

In conventional laminates, the thickness of fluorocarbon separating the metallic foil from the nearest layer of glass cloth is not greater than 5 mils, and typically less than 3 mils.

When such a conventional laminate, for example CuClad 233 discussed above, in 90 mil thickness, is manually bent around a twelve inch diameter object, no sharp edged wrinkles of the inner surface are observed; similar results are obtained utilizing a ten inch diameter bend. However, as one attempts an 8¾ inch diameter bend, the onset or initiation of wrinkles is evident, and at an 8⅛ inch diameter, bad wrinkles are noted in the inner metallic surface. However, when a structure was made which had a layer of at least about seven mils of PTFE between the inner metallic surface and the first glass cloth layer, only slight ripples were noted at the 8¾ inch diameter bend. At 11.5 mils of PTFE betwen the inner metallic surface and the first glass cloth layer, no wrinkles and only slight ripples were noted all the way down to a seven inch diameter bend. When the resin thickness was increased to 16 mils, bends down to seven inch diameter can be performed with only slight ripples being found.

I claim:

1. In a metal clad laminate of at least about 20 mils dielectric thickness having a metallic foil on at least one surface thereof and containing at least one low-loss dielectric soft polymeric material having a room temperature elongation of at least about 75 percent and a tensile modulus of less than about 120,000 psi and wherein the polymer must have a dielectric loss tangent of less than 0.001 in the frequency range of from about 1 to about 10$^G$Hz and at least two layers of glass cloth reinforcement, the improvement comprising the separation of said metallic foil from the nearest of said layers of glass cloth reinforcement with at least about 7 mils of said soft polymeric material.

2. The laminate of claim 1 wherein said polymeric material is a fluorocarbon.

3. The laminate of claim 2 wherein said fluorocarbon is polytetrafluoroethylene.

4. The laminate of claim 1 wherein said polymeric material includes a thermoplastic fluorocarbon resin.

5. The laminate of claim 1 wherein said separation is at least about 10 mils.

6. The laminate of claim 1 wherein said dielectric thickness is 90 mils.

7. The laminate of claim 6 wherein said separation is at least 10 mils.

* * * * *